(12) United States Patent
Chang

(10) Patent No.: US 7,928,422 B2
(45) Date of Patent: Apr. 19, 2011

(54) PHASE CHANGE MEMORY DEVICE CAPABLE OF INCREASING SENSING MARGIN AND METHOD FOR MANUFACTURING THE SAME

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 312 days.

(21) Appl. No.: 12/045,280

(22) Filed: Mar. 10, 2008

(65) Prior Publication Data
US 2009/0114897 A1    May 7, 2009

(30) Foreign Application Priority Data
Nov. 7, 2007    (KR) .......................... 10-2007-0113313

(51) Int. Cl.
*H01L 29/04*    (2006.01)
(52) U.S. Cl. .......................... 257/3; 257/2; 257/E29.105
(58) Field of Classification Search ................ 257/2, 3, 257/509, 510, E29.105
See application file for complete search history.

(56) References Cited

U.S. PATENT DOCUMENTS

| 5,920,788 | A * | 7/1999 | Reinberg | 438/466 |
| 7,838,860 | B2* | 11/2010 | Happ et al. | 257/2 |
| 2002/0081807 | A1* | 6/2002 | Xu | 438/262 |
| 2003/0094652 | A1* | 5/2003 | Hudgens et al. | 257/335 |
| 2003/0219924 | A1* | 11/2003 | Bez et al. | 438/102 |
| 2004/0214415 | A1* | 10/2004 | Pellizzer et al. | 438/583 |
| 2006/0073684 | A1 | 4/2006 | Schulze et al. | |
| 2007/0215948 | A1* | 9/2007 | Yang | 257/355 |

FOREIGN PATENT DOCUMENTS

| KR | 10-0501932 B1 | 7/2005 |
| KR | 10-0546790 B1 | 1/2006 |
| KR | 10-0574357 B1 | 4/2006 |

* cited by examiner

*Primary Examiner* — Kiesha R Bryant
*Assistant Examiner* — Mark W Tornow
(74) *Attorney, Agent, or Firm* — Ladas & Parry LLP

(57) ABSTRACT

A phase change memory device capable of increasing a sensing margin and a method for manufacturing the same. The phase change memory device includes a semiconductor substrate formed with a device isolation structure which defines active regions; first conductivity type impurity regions formed in surfaces of the active regions and having the shape of a line; a second conductivity type well formed in the semiconductor substrate at a position lower than the device isolation structure; a second conductivity type ion-implantation layer formed in the semiconductor substrate at a boundary between a lower end of the device isolation structure and the semiconductor substrate; a plurality of vertical PN diodes formed on the first conductivity type impurity regions; and phase change memory cells formed on the vertical PN diodes.

6 Claims, 11 Drawing Sheets

PHASE CHANGE MEMORY DEVICE CAPABLE OF INCREASING SENSING MARGIN AND METHOD FOR MANUFACTURING THE SAME

CROSS-REFERENCE TO RELATED APPLICATIONS

The present application claims priority to Korean patent application number 10-2007-0113313 filed on Nov. 7, 2007, which is incorporated herein by reference in its entirety.

BACKGROUND OF THE INVENTION

The present invention relates to a phase change memory device and a method for manufacturing the same, and more particularly to a phase change memory device, which can decrease leakage current and increase a sensing margin and a method for manufacturing the same.

Memory devices are largely classified into a volatile RAM (random access memory) which loses inputted information when power is interrupted and a non-volatile ROM (read-only memory) which continuously maintains the stored state of the inputted information even when power is interrupted. The different types of a volatile RAM include a DRAM (dynamic RAM) and an SRAM (static RAM), and the different types of the non-volatile ROM include a flash memory device such as an EEPROM (electrically erasable and programmable ROM).

It is well known in the art that a DRAM is an excellent memory device, but a DRAM requires a high charge storing capacity, which in turn requires the surface area of an electrode to increase, such that a high level of integration very difficult to accomplish. Further, in a flash memory device, a higher operation voltage than a power source voltage is required due to the two gates stacked upon each other in a flash memory device, such that a separate booster circuit is needed to supply a voltage required for write and delete operations. All these factors present difficulties to accomplish a higher level of integration.

Under these situations, the so-called phase change memory device drew attention for search in an effort to develop a novel memory device having a simple configuration and capable of accomplishing a high level of integration while retaining the characteristics of the non-volatile memory device.

In a phase change memory device, a phase change from a crystalline state to an amorphous state occurs in a phase change layer interposed between a lower electrode and an upper electrode due to a current flow between the lower electrode and the upper electrode, and the information stored in a cell is recognized by utilizing the difference in resistance between the crystalline state and the amorphous state.

A chalcogenide layer being a compound layer made of germanium (Ge), stibium (Sb), and tellurium (Te) is used as a phase change layer in a phase change memory device. When a current is applied, heat is produced, i.e., the Joule heat, in the phase change layer, and the heat causes the phase change layer to change the phase between the amorphous state and the crystalline state. The resistance of a phase change layer in the amorphous state is higher than the resistance of the phase change layer in the crystalline state, as such whether the information stored in a phase change cell has a logic value of '1' or '0' can be determined by sensing the current flowing through the phase change layer in a read mode.

When manufacturing a phase change memory device over 512 Mb, vertical PN diodes were suggested in the art for use as the switching elements, as such the use of vertical PN diodes as the switching elements could allow the cell size to decrease less than $6F^2$.

The vertical PN diodes are formed in the line-shaped N-type impurity regions formed in the active regions. Plugs contacting the electrodes that are electrically connected to the word lines are formed on the N-type impurity regions formed between the vertical PN diodes.

Among the electrodes electrically connected to the word lines, Vdd applied to the electrodes connected to the non-selected word lines is +1V in a read operation or +2V in a write operation. Zero voltage (0V) is applied to the electrodes electrically connected to the selected word lines.

However, there are problems in the conventional art in that, when the zero voltage is applied to the electrodes connected to the selected word lines, a voltage of up to 5V is consequently applied to the other electrodes adjoining the electrodes connected to the selected word lines. When the voltage difference between the electrodes increases up to 5V, this would lead to formation of NPN bipolar transistors, which in turn causes a leakage current to be produced along the lower boundary of the device isolation structure. Because this type of leakage current can exert influence on the current flowing from the vertical PN diodes to the electrodes connected to the selected word lines, it will affect the sensing margin of the phase change memory device to decrease.

One solution proposed for solving this problem suggests forming a device isolation structure to an increased depth so as to decrease the leakage current; however, this is not considered a plausible solution since it will inevitably increase the cell size, thereby decreasing the cell efficiency.

SUMMARY OF THE INVENTION

Embodiments of the present invention are directed to a phase change memory device, which can decrease leakage current and a method for manufacturing the same.

Also, embodiments of the present invention are directed to a phase change memory device, which can increase a sensing margin and a method for manufacturing the same.

In one aspect, a phase change memory device comprises a semiconductor substrate formed with a device isolation structure which defines active regions; first conductivity type impurity regions formed in surfaces of the active regions and having the shape of a line; a second conductivity type well formed in the semiconductor substrate at a position lower than the device isolation structure; a second conductivity type ion-implantation layer formed in the semiconductor substrate at a boundary between a lower end of the device isolation structure and the semiconductor substrate; a plurality of vertical PN diodes formed on the first conductivity type impurity regions; and phase change memory cells formed on the vertical PN diodes.

The phase change memory device further comprises a first conductivity type well formed in the semiconductor substrate at a position lower than the second conductivity type well.

The second conductivity type ion-implantation layer is formed at a depth which is the same as or lower than the lower end of the device isolation structure.

The phase change memory device further comprises a second conductivity type ion-implantation layer for preventing the occurrence of a punch-through, formed in the semiconductor substrate at a depth similar to the first conductivity type impurity regions.

The second conductivity type ion-implantation layer for preventing the occurrence of a punch-through is formed at a depth which is the same as or lower than the first conductivity type impurity regions.

The first conductivity type is an N-type, and the second conductivity type is a P-type.

The phase change memory device further comprises bit lines formed to come into contact with the phase change memory cells; plugs formed on the first conductivity type impurity regions; and word lines formed over the bit lines to come into contact with the first conductivity type impurity regions via the plugs.

In another aspect, a method for manufacturing a phase change memory device comprises the steps of forming a device isolation structure which defines active regions, in a semiconductor substrate; forming a second conductivity type well and a second conductivity type ion-implantation layer, by implementing an impurity-ion implantation process for the semiconductor substrate; forming line-shaped first conductivity type impurity regions in surfaces of the active regions; forming a plurality of vertical PN diodes on the first conductivity type impurity regions; and forming phase change memory cells on the vertical PN diodes.

The step of forming the second conductivity type well and the second conductivity type ion-implantation layer comprises the steps of forming a second conductivity type well in the semiconductor substrate at a position lower than the device isolation structure; and forming a second conductivity type ion-implantation layer in the semiconductor substrate at a boundary between a lower end of the device isolation structure and the semiconductor substrate.

The step of forming the second conductivity type well and the second conductivity type ion-implantation layer comprises the steps of forming a second conductivity type ion-implantation layer in the semiconductor substrate at a boundary between a lower end of the device isolation structure and the semiconductor substrate; and forming a second conductivity type well in the semiconductor substrate at a position lower than the device isolation structure.

After the step of forming the device isolation structure and before the step of forming the second conductivity type well and the second conductivity type ion-implantation layer, the method further comprises the step of forming a first conductivity type well in the semiconductor substrate at a position lower than the second conductivity type well.

The second conductivity type well is formed through an ion-implantation process which is implemented with energy of 100~500 KeV at a dose of $1\times10^{17}$~$1\times10^{19}$ ions/cm$^3$.

The second conductivity type ion-implantation layer is formed at a depth which is the same as or lower than the device isolation structure.

The second conductivity type ion-implantation layer is formed through an ion-implantation process which is implemented with energy of 50~200 KeV at a dose of $1\times10^{17}$~$1\times10^{19}$ ions/cm$^3$.

After the step of forming the second conductivity type well and the second conductivity type ion-implantation layer and before the step of forming the first conductivity type impurity regions, the method further comprises the step of forming a second conductivity type ion-implantation layer for preventing the occurrence of a punch-through, in the semiconductor substrate at a depth similar to the first conductivity type impurity regions.

The second conductivity type ion-implantation layer for preventing the occurrence of a punch-through is formed at a depth which is the same as or lower than the first conductivity type impurity regions.

The second conductivity type ion-implantation layer for preventing the occurrence of a punch-through is formed through an ion-implantation process which is implemented with energy of 10~150 KeV at a dose of $1\times10^{17}$~$1\times10^{19}$ ions/cm$^3$.

The first conductivity type impurity regions are formed through an ion-implantation process which is implemented with energy of 10~80 KeV at a dose of $1\times10^{19}$~$1\times10^{21}$ ions/cm$^3$.

The first conductivity type is an N-type, and the second conductivity type is a P-type.

After the step of forming the phase change memory cells, the method further comprises the steps of forming bit lines to come into contact with the phase change memory cells; forming plugs on the first conductivity type impurity regions; and forming word lines over the bit lines to come into contact with the first conductivity type impurity regions via the plugs.

DESCRIPTION OF SPECIFIC EMBODIMENTS

In the present invention, by implementing a P-type impurity-ion implantation process for the semiconductor substrate formed with a device isolation structure for defining active regions, a P-type well and a P-type ion-implantation layer are formed. At this time, the P-type ion-implantation layer is formed at a boundary between the lower end of the device isolation structure and the semiconductor substrate. Then, line-shaped N-type impurity regions are formed in the surfaces of the active regions.

By this fact, in the present invention, since the N-type impurity regions are formed in the P-type well, noise can be decreased when PN diodes operate. Also, in the present invention, because the P-type ion-implantation layer is formed in the semiconductor substrate at a depth similar to the lower end of the device isolation structure, it is possible to decrease leakage current which is caused along the lower boundary of the device isolation structure due to a difference in voltage between the electrodes connected with word lines. As a result, in the present invention, the sensing margin of a phase change memory device can be increased.

Hereafter, specific embodiments of the present invention will be described in detail with reference to the attached drawings.

Figure 1:
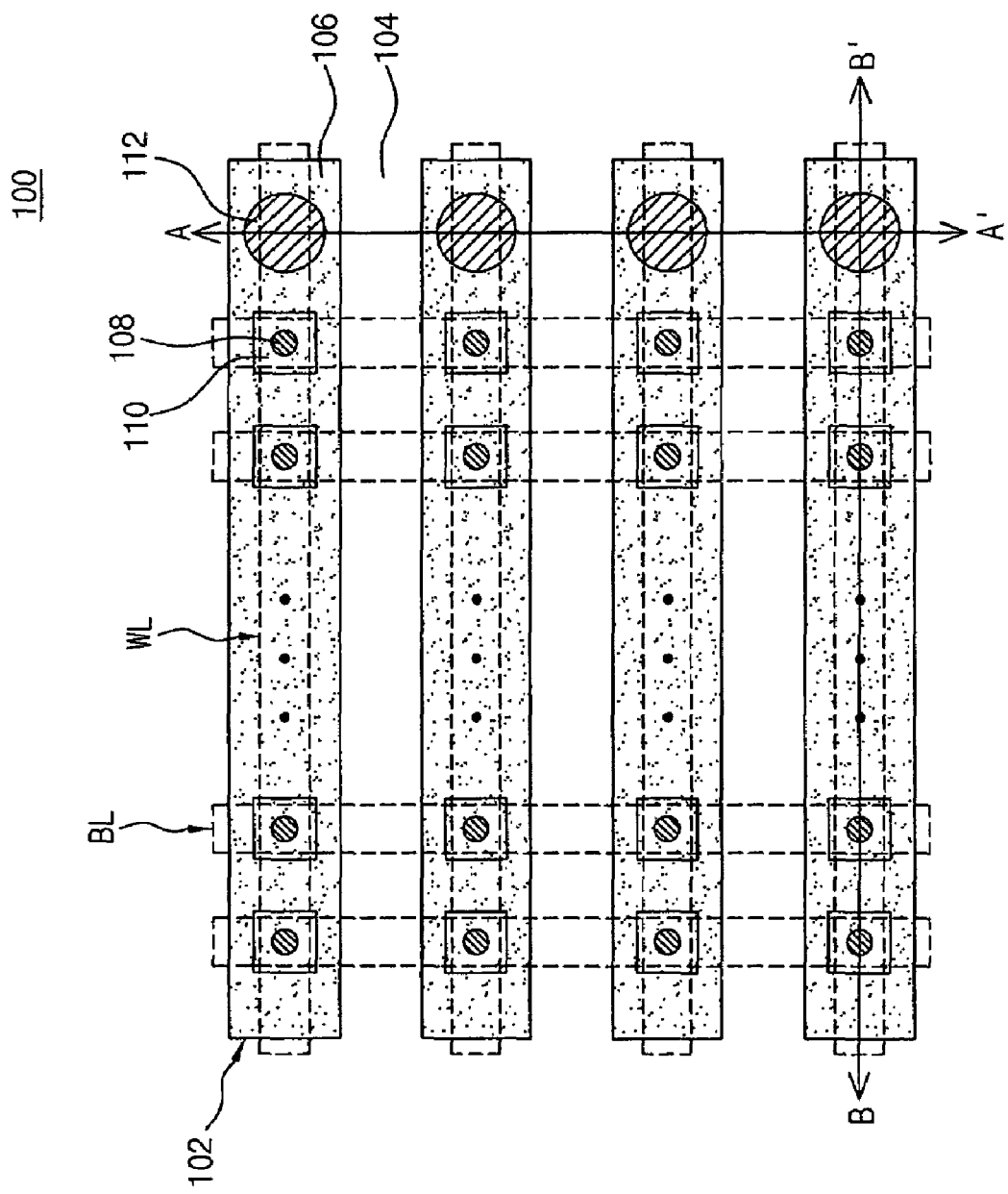
FIG. 1 is a plan view illustrating a phase change memory device.

FIG. 1 is a plan view illustrating a phase change memory device. Shown in FIG. 1 a semiconductor substrate 100, active regions 102, a device isolation structure 104, N-type impurity regions 106, vertical PN diodes 108, phase change memory cells 110, plugs 112, bit lines BL, and word lines WL.

Figure 2A:
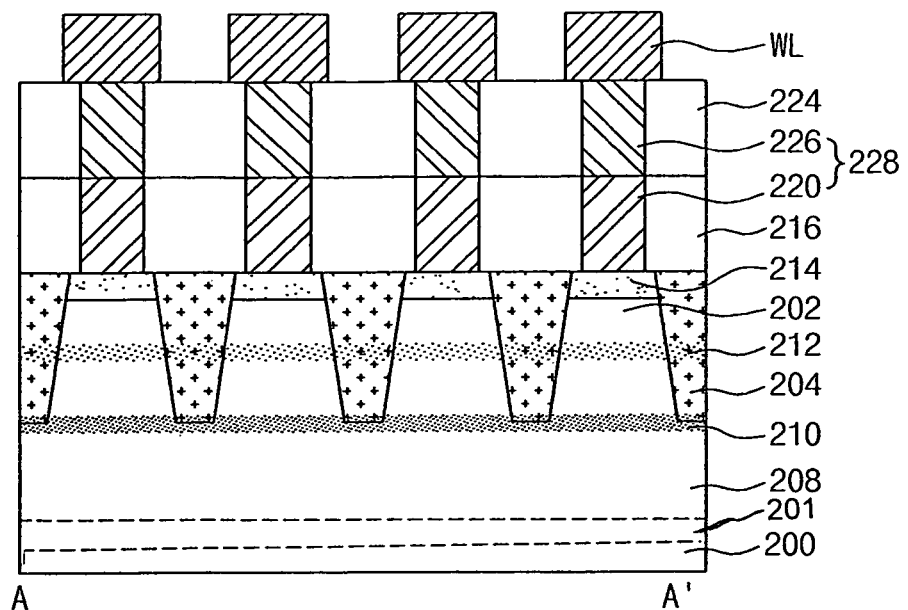
FIG. 2 is cross-sectional views taken along the line A-A' and B-B' of FIG. 1, illustrating a phase change memory device in accordance with an embodiment of the present invention.
Figure 2B:
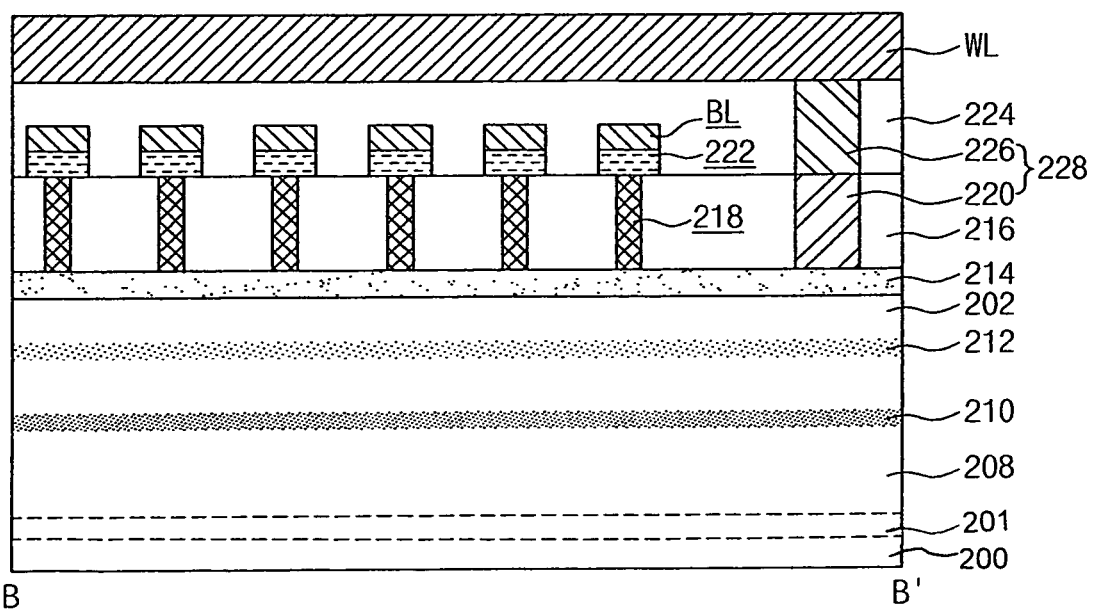

FIGS. 2A-2B are cross-sectional views taken along the line A-A' and B-B' of FIG. 1, illustrating a phase change memory device in accordance with an embodiment of the present invention.

A device isolation structure 204 is formed in a semiconductor substrate 200 to define active regions 202. Line-shaped N-type impurity regions 214 are formed in the surfaces of the active regions 202. The device isolation structure 204 is formed to have a depth of 1,000~3,000 Å. A P-type well 208 is formed in the semiconductor substrate 200 at a position lower than the device isolation structure 204, and a P-type ion-implantation layer 210 is formed in the semiconductor substrate 200 at a depth similar to the lower end of the device isolation structure 204.

An N-type well 201 can be formed in the semiconductor substrate 200 at a position lower than the P-type well 208. The P-type ion-implantation layer 210 is formed at a depth which is the same as or lower than the lower end of the device isolation structure 204.

The P-type well 208 functions to reduce noise when vertical PN diodes 218 operate, and the P-type ion-implantation layer 210 functions to decrease leakage current which is caused along the lower boundary of the device isolation structure 204. Accordingly, in the present invention, the sensing margin of a phase change memory device can be increased.

Also, a P-type ion-implantation layer 212 for preventing the occurrence of a punch-through can be formed in the semiconductor substrate 200 at a depth similar to the N-type impurity regions 214. At this time, the P-type ion-implantation layer 212 for preventing the occurrence of a punch-through can be formed at a depth which is the same as or lower than the N-type impurity regions 214.

The P-type ion-implantation layer 212 for preventing the occurrence of a punch-through functions to further decrease the leakage current which is caused along the lower boundary of the device isolation structure 204, and through this, the sensing margin of the phase change memory device can be more effectively increased.

The plurality of vertical PN diodes 218 (see FIG. 2B) are formed on the N-type impurity regions 214, and phase change memory cells 222 are formed on the vertical PN diodes 218. Next, bit lines BL are formed to come into contact with the phase change memory cells 222 and to extend in a direction perpendicular to the active regions 202. Word lines WL, which extend in a direction parallel to the active regions 202, are formed over the bit lines BL. Plugs 228, which connect the N-type impurity regions 214 and the word lines WL with each other, are formed on the N-type impurity regions 214.

Further, a first interlayer dielectric 216, first plugs 220, a second interlayer dielectric 224, and second plugs 226 are also formed as shown in FIGS. 2A-2B.

FIGS. 3A-3B, 4A-4B, 5A-5B, 6A-6B, 7A-7B, 8A-8B, 9A-9B, 10A-10B, and 11A-11B are cross-sectional views where each pair of figures are taken in correspondence with the line A-A' and B-B' respectively of FIG. 1 for illustrating the processes of manufacturing a phase change memory device in accordance with an embodiment of the present invention.

Figure 3A:
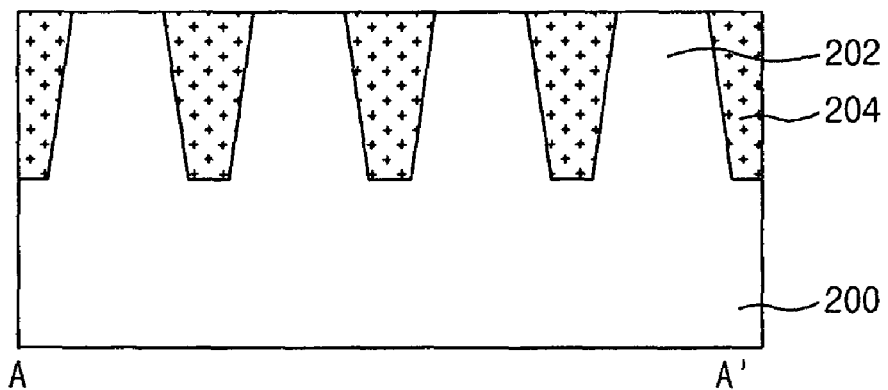
FIGS. 3A-3B, 4A-4B, 5A-5B, 6A-6B, 7A-7B, 8A-8B, 9A-9B, 10A-10B, 11A-11B are cross-sectional views, each pair of which is taken in correspondence with the line A-A' and B-B' of FIG. 1 respectively for illustrating the processes of a method for manufacturing a phase change memory device in accordance with another embodiment of the present invention.
Figure 3B:
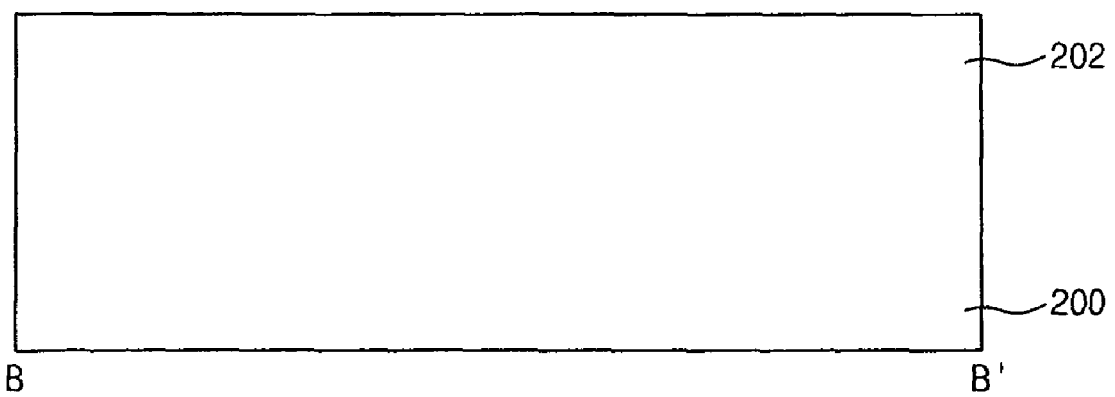

Referring to FIGS. 3A-3B, a device isolation structure 204 is formed in a semiconductor substrate 200 to define bar-shaped active regions 202 which are separated from one another. The device isolation structure 204 is formed to have a depth of 1,000~3,000 Å.

Figure 4A:
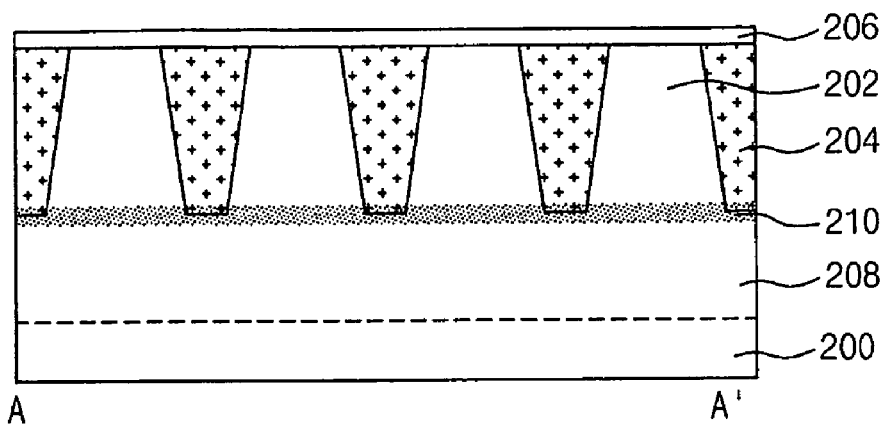
Figure 4B:
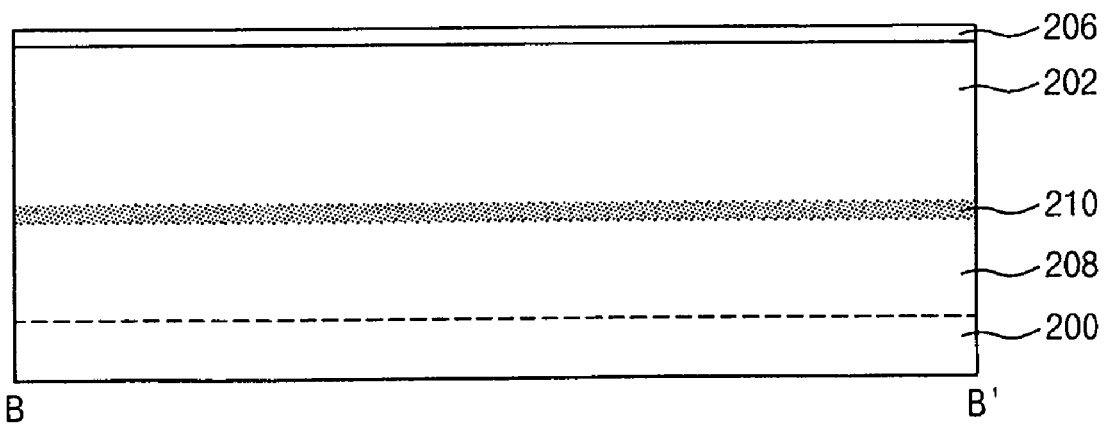

Referring to FIGS. 4A-4B, after forming a first buffer oxide layer 206 on the semiconductor substrate 200 formed with the device isolation structure 204 to have a thickness less than 100 Å, by implementing P-type impurity-ion implantation processes, a P-type well 208 and a P-type ion-implantation layer 210 are formed. The buffer oxide layer 206 functions to protect the surface of the semiconductor substrate 200 when implementing the ion implantation processes with high energy.

The P-type impurity-ion implantation process for forming the P-type well 208 is implemented using B or $BF_2$ with energy of 100~500 KeV at a dose of $1\times10^{17}$~$1\times10^{19}$ ions/$cm^3$, and it is preferred that the P-type well 208 be formed at a position lower than the device isolation structure 204. The P-type impurity-ion implantation process for forming the P-type ion-implantation layer 210 is implemented using B or $BF_2$ with energy of 50~200 KeV at a dose of $1\times10^{17}$~$1\times10^{19}$ ions/$cm^3$, and it is preferred that the P-type ion-implantation layer 210 be formed at a depth which is the same as or lower than the lower end of the device isolation structure 204.

When forming the P-type well 208 and the P-type ion-implantation layer 210, it is preferred to form the P-type well 208 before forming the P-type ion-implantation layer 210, but this forming sequence can be reversed such that the P-type ion-implantation layer 210 can be formed before forming the P-type well 208. Also, a N-type well (not shown) can be formed in the semiconductor substrate 200 at a position lower than the P-type well 208 by implementing an N-type impurity-ion implantation process for the semiconductor substrate 200 before forming the P-type well 208 and the P-type ion-implantation layer 210.

Figure 5A:
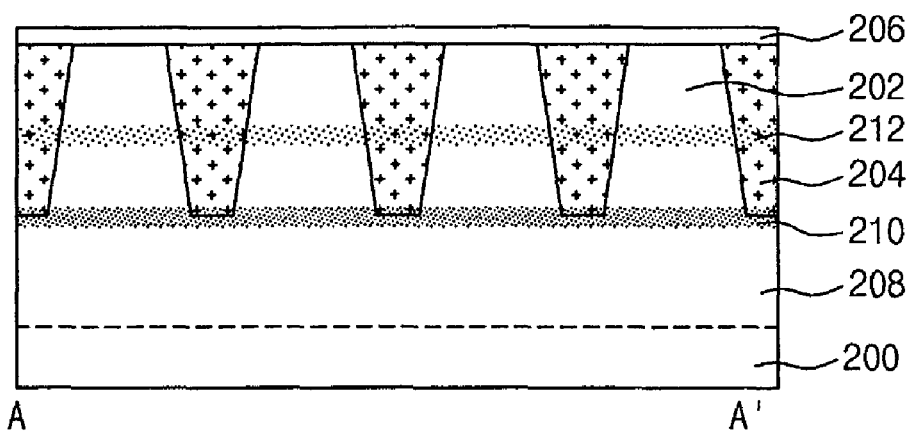
Figure 5B:
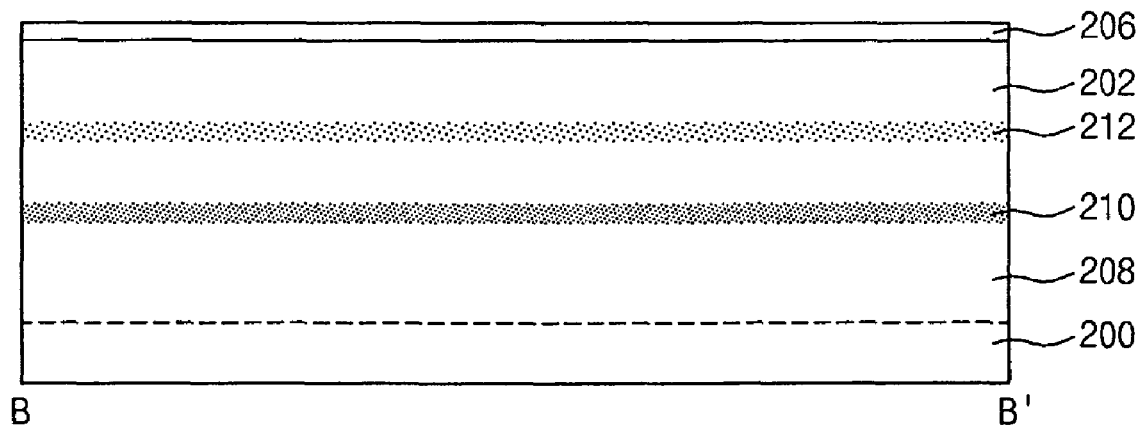

Referring to FIGS. 5A-5B, a P-type ion-implantation layer 212 for preventing the occurrence of a punch-through is formed by implementing a P-type impurity-ion implantation process for the semiconductor substrate 200, which is formed with the P-type well 208 and the P-type ion-implantation layer 210. The P-type impurity-ion implantation process for forming the P-type ion-implantation layer 212 for preventing the occurrence of a punch-through is implemented using B or $BF_2$ with energy of 10~150 KeV at a dose of $1\times10^{17}$~$1\times10^{19}$ ions/$cm^3$, and it is preferred that the P-type ion-implantation layer 212 for preventing the occurrence of a punch-through be formed at a depth which is the same as or lower than N-type impurity regions to be subsequently formed.

Figure 6A:
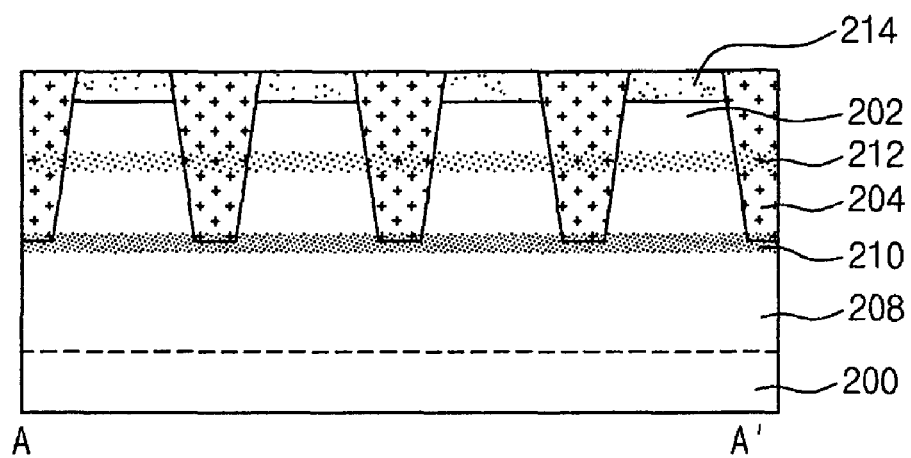
Figure 6B:
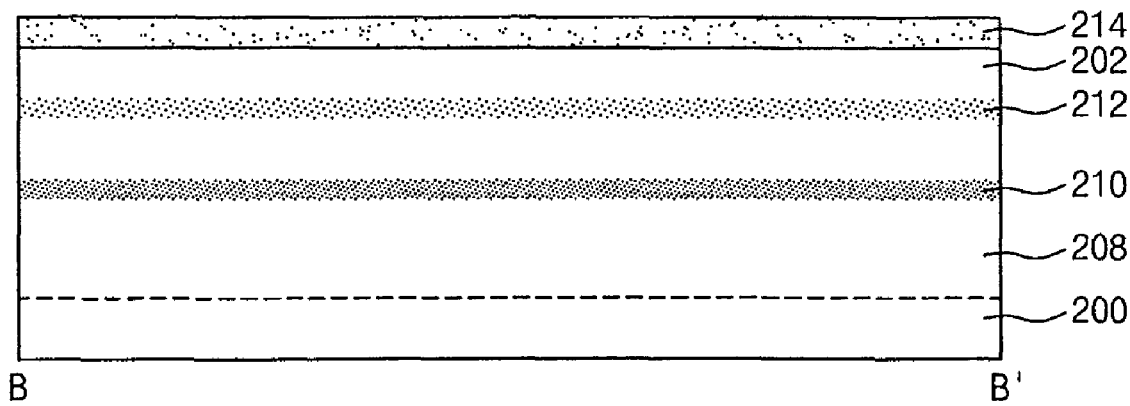

Referring to FIGS. 6A-6B, after removing the first buffer oxide layer 206 from the semiconductor substrate 200 (that is formed with the P-type well 208, the P-type ion-implantation layer 210 and the P-type ion-implantation layer 212 for preventing the occurrence of a punch-through), a second buffer oxide layer (not shown) is formed. And then, an N-type impurity-ion implantation process is implemented. The N-type impurity-ion implantation process is implemented using P or As with energy of 10~80 KeV at a dose of $1\times10^{19}$~$1\times10^{21}$ ions/$cm^3$, and through this, line-shaped N-type impurity regions 214 are formed in the surfaces of the active regions 202 corresponding to cell areas. It is preferred that the N-type impurity-ion implantation process be implemented at a sufficiently high dose so as to decrease the resistance of the N-type impurity regions 214 and with energy having a level which is the same as or higher than a core region or a peripheral circuit region.

Figure 7A:
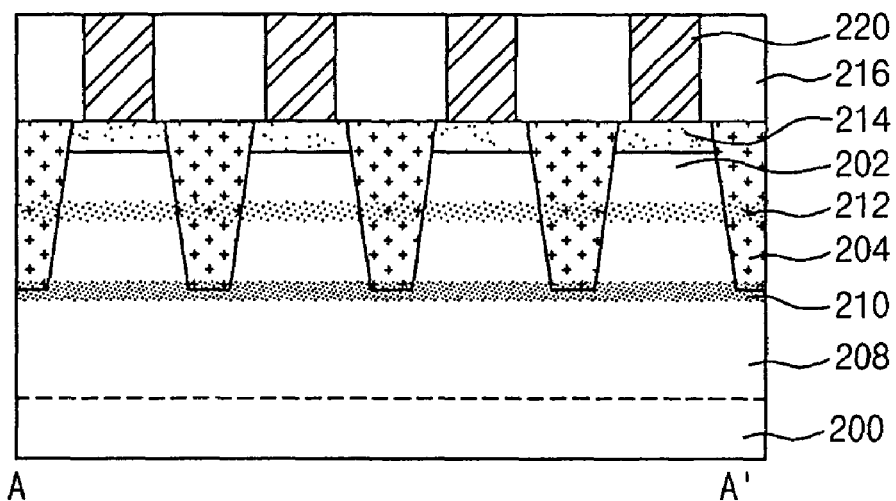
Figure 7B:
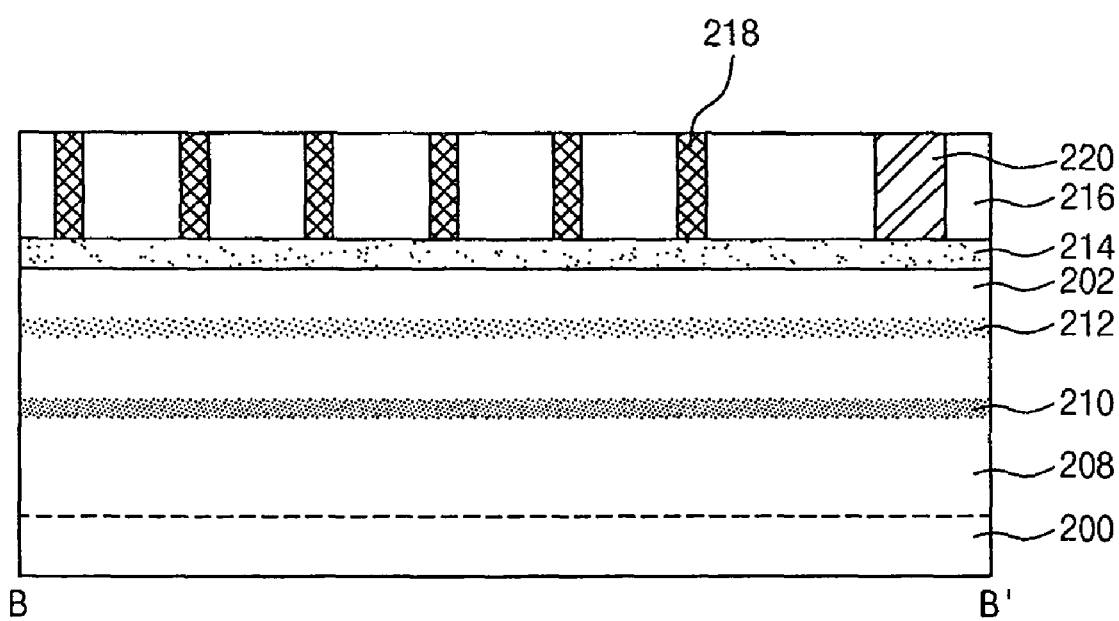

Referring to FIGS. 7A-7B, after removing the second buffer oxide layer (not shown), a first interlayer dielectric 216 is deposited on the semiconductor substrate 200 which is formed with the N-type impurity regions 214. Then, by etching the first interlayer dielectric 216, a plurality of contact holes are defined to expose the N-type impurity regions 214. Thereupon, a plurality of vertical PN diodes 218 are formed in the contact holes. The contact holes are defined for a predetermined number of vertical PN diodes 218 on each N-type impurity region 214, and it is preferred that, in order to electrically connect the N-type impurity regions 214 with word lines to be subsequently formed, first plugs 220 be formed together with the vertical PN diodes 218.

Figure 8A:
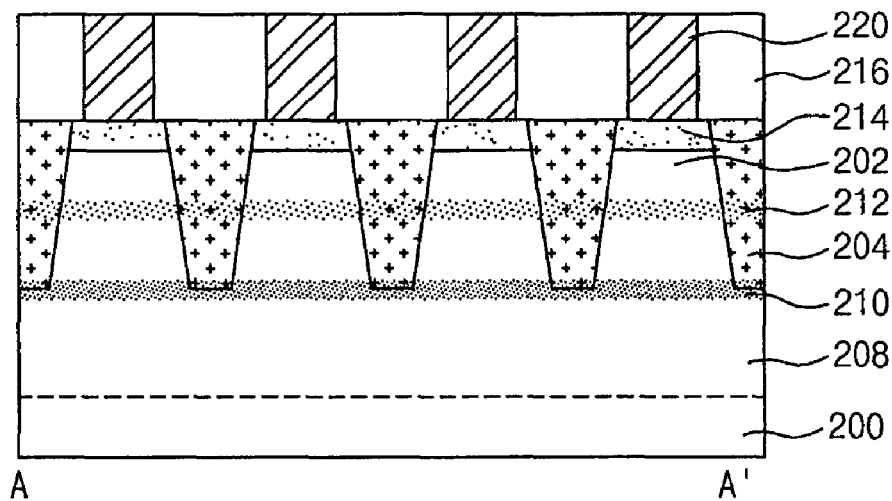
Figure 8B:
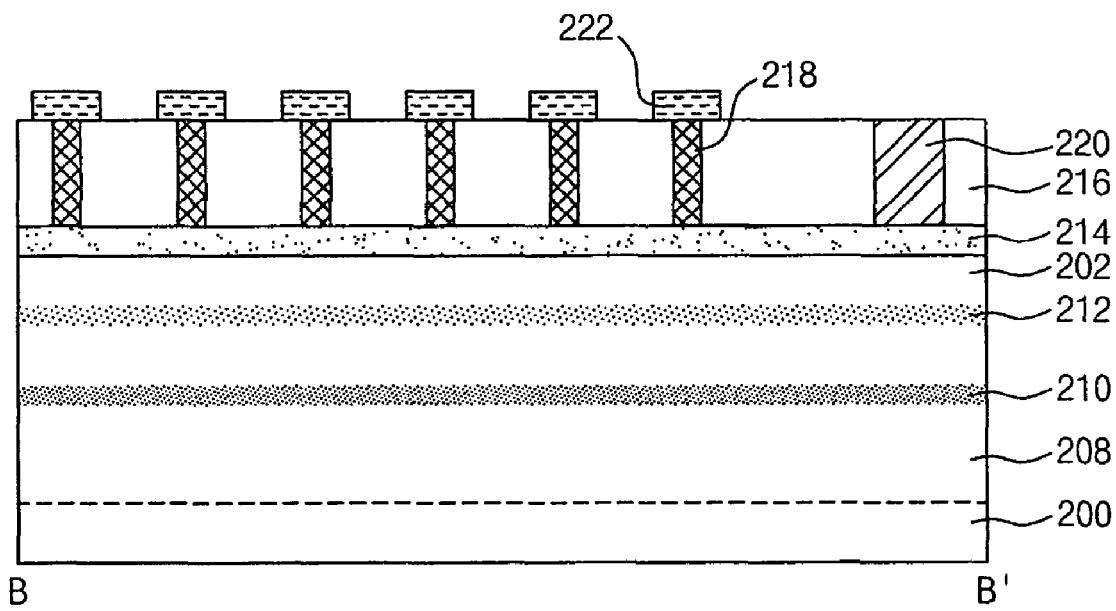

Referring to FIGS. 8A-8B, phase change memory cells 222 are formed on the vertical PN diodes 218. Preferably, the phase change memory cells 222 are formed in a manner such that lower electrode contacts (not shown), lower electrodes (not shown), a phase change layer (not shown), upper electrodes (not shown), and upper electrode contacts (not shown) are sequentially formed on the vertical PN diodes 218.

Figure 9A:
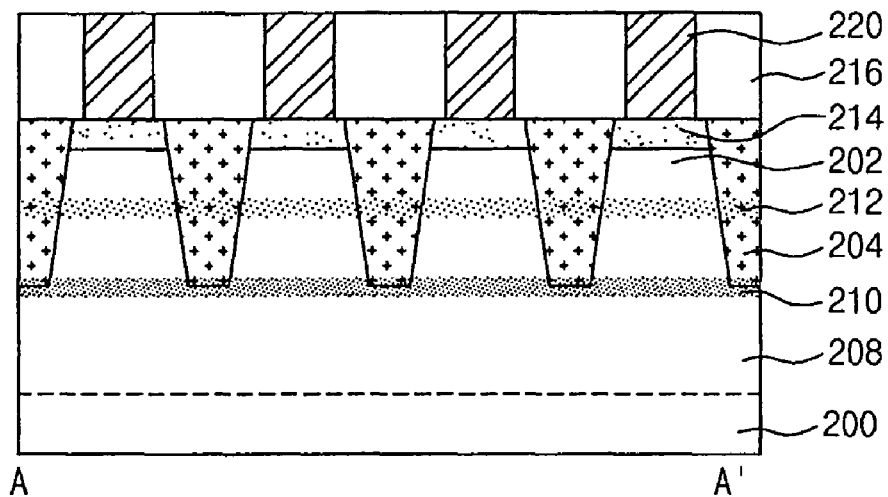
Figure 9B:
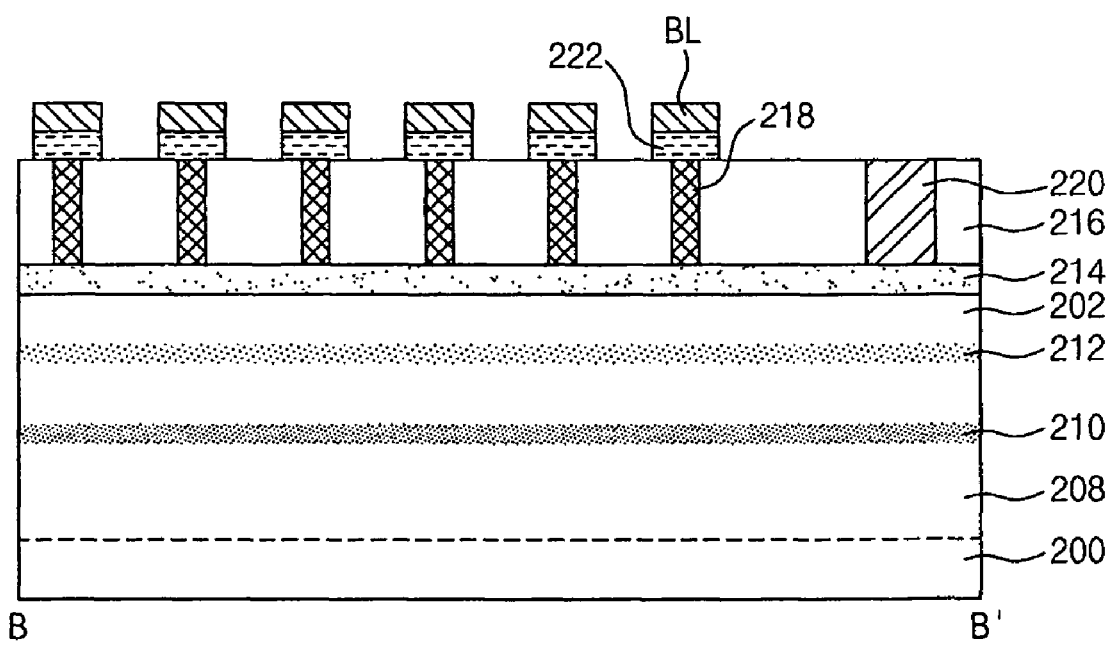

Referring to FIGS. 9A-9B, the bit lines BL are formed on the phase change memory cells 222. It is preferred that the bit lines BL be formed in a linear shape as in lines which extend in a direction perpendicular to the active regions 202.

Figure 10A:
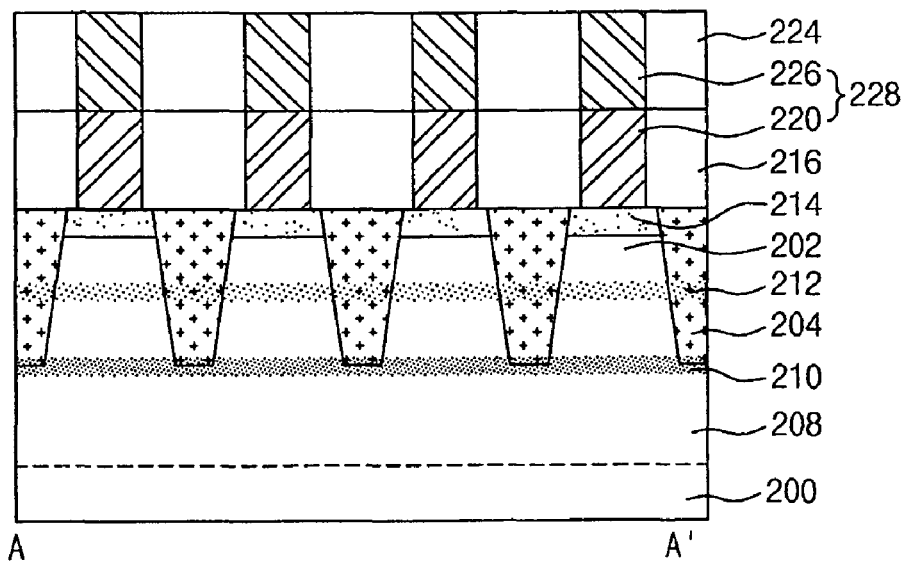
Figure 10B:
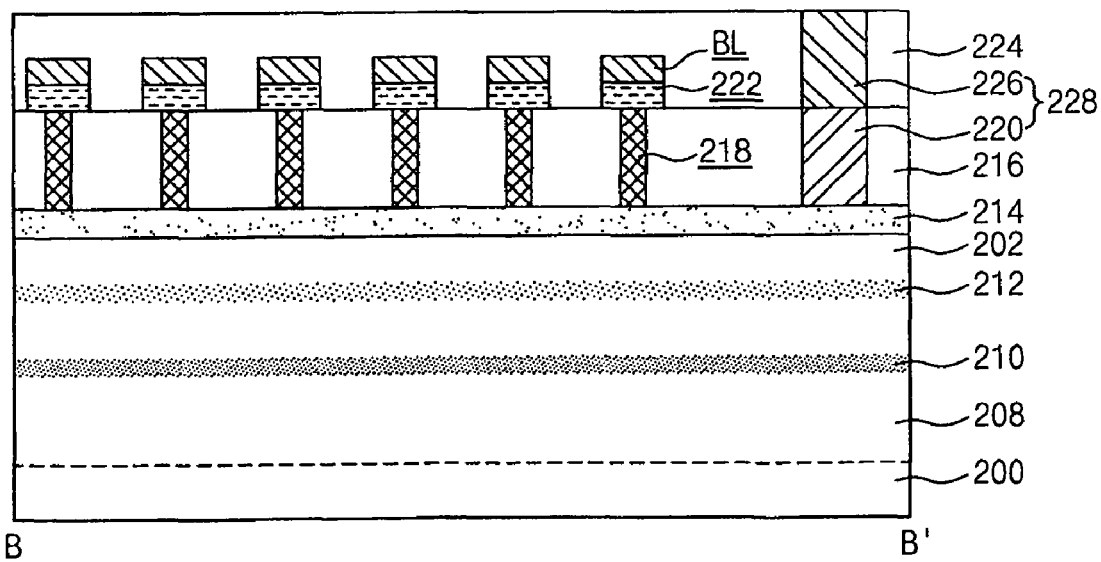

Referring to FIGS. 10A-10B, after forming a second interlayer dielectric 224 on the resultant semiconductor substrate 200 formed with the bit lines BL, the second interlayer dielectric 224 is etched to define contact holes to expose the first plugs 220. Next, second plugs 226 connected to the first plugs 220 are formed in the contact holes, such that the plugs 228 comprising the first and second plugs 220 and 226 are formed on the N-type impurity regions 214.

Figure 11A:
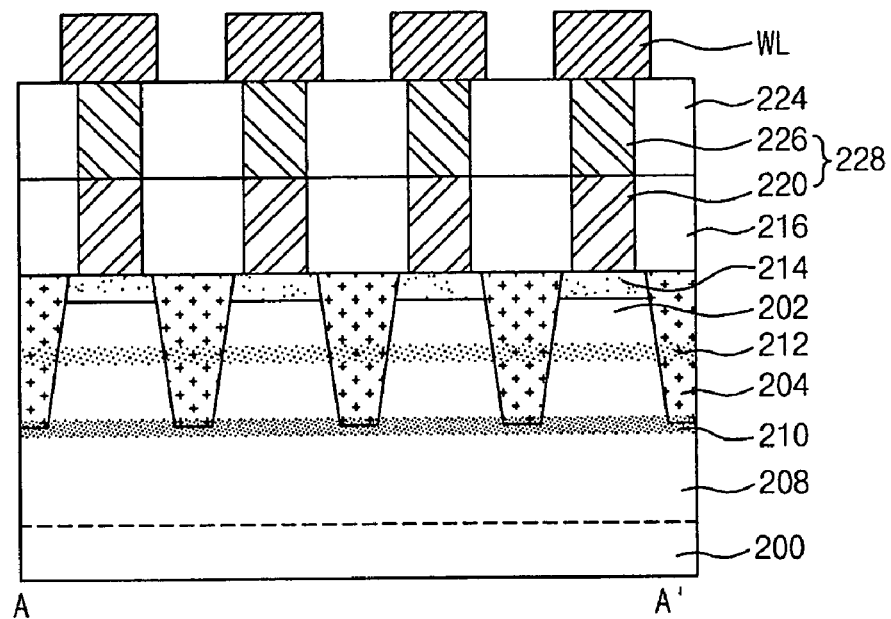
Figure 11B:
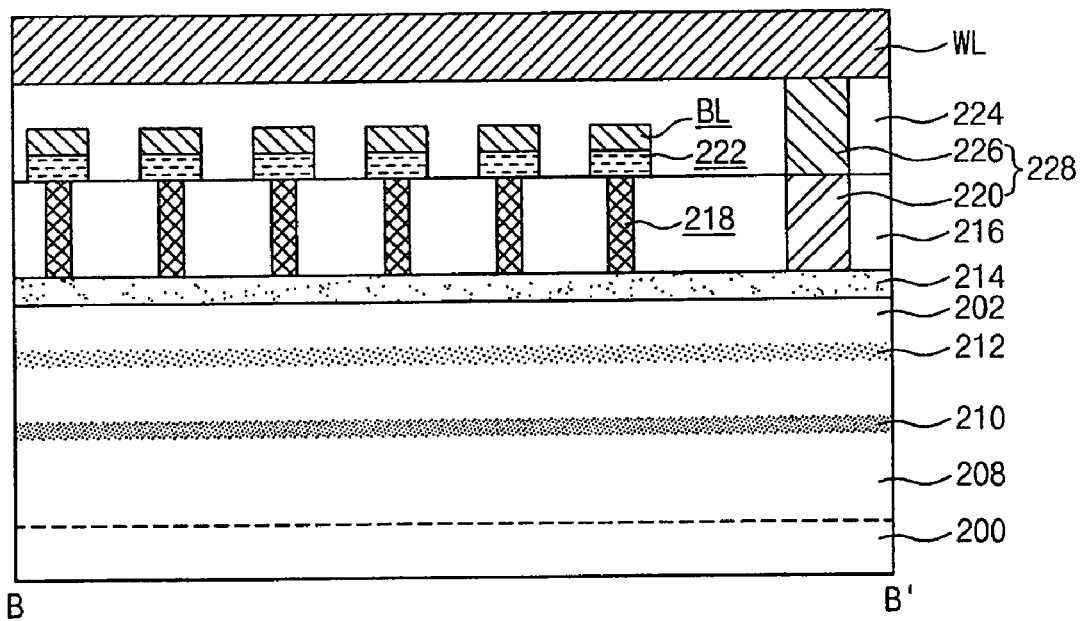

Referring to FIGS. 11A-11B, word lines WL are formed on the second interlayer dielectric 224 such that each word line WL is electrically connected to the corresponding N-type impurity region 214 via the corresponding plug 228. It is preferred that the word lines WL be formed in a linear shape such as lines which extend in the direction parallel to the active regions 202.

Thereafter, a series of processes (although not illustrated in the drawings) are subsequently implemented to complete the manufacture of the phase change memory device according to an embodiment of the present invention.

In the phase change memory device according an embodiment of the present invention as described above, the P-type well 208 is formed in the semiconductor substrate 200, and the N-type impurity regions 214 are formed in the P-type well 208, and these decrease (or eliminate) the noise when the PN diodes 218 operate.

Also, in the phase change memory device according to an embodiment of the present invention, since the P-type ion-implantation layer 210 is formed in the semiconductor substrate 200 at a depth similar to the lower end of the device isolation structure 204, the difference in voltage between the electrodes connected to the word lines WL can decrease, so as to decrease the leakage current, which is caused along the lower boundary of the device isolation structure 204.

Moreover, in the phase change memory device according to an embodiment of the present invention, the leakage current can be more effectively decreased, and the sensing margin of the phase change memory device can be increased, because the P-type ion-implantation layer 212 for preventing the occurrence of a punch-through is additionally formed in the semiconductor substrate 200 at a depth similar to the N-type impurity regions 214.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A phase change memory device comprising:
   a semiconductor substrate formed with a device isolation structure which defines active regions;
   an N-type well formed in the semiconductor substrate;
   N-type impurity regions formed in the active regions in a linear shape;
   a P-type well formed in the N-type well at a position lower than the device isolation structure;
   a P-type ion-implantation layer formed in the semiconductor substrate at a boundary between a lower end of the device isolation structure and the semiconductor substrate;
   a plurality of vertical PN diodes formed on the N-type impurity regions; and
   phase change memory cells formed on the vertical PN diodes.

2. The phase change memory device according to claim 1, further comprising:
   the N-type well formed in the semiconductor substrate at a position lower than the P-type well.

3. The phase change memory device according to claim 1, wherein the P-type ion-implantation layer is formed at a depth which is the same as or lower than the lower end of the device isolation structure.

4. The phase change memory device according to claim 1, further comprising:
   the P-type ion-implantation layer for preventing the occurrence of a punch-through, formed in the semiconductor substrate at a depth similar to the N-type impurity regions.

5. The phase change memory device according to claim 4, wherein the P-type ion-implantation layer for preventing the occurrence of a punch-through is formed at a depth which is the same as or lower than the N-type impurity regions.

6. The phase change memory device according to claim 1, further comprising:
   bit lines formed to come into contact with the phase change memory cells;
   plugs formed on the N-type impurity regions; and
   word lines formed over the bit lines to come into contact with the N-type impurity regions via the plugs.

* * * * *